(12) United States Patent
Horikoshi

(10) Patent No.: US 7,211,511 B2
(45) Date of Patent: May 1, 2007

(54) METHOD FOR MANUFACTURING A MAGNETIC MEMORY DEVICE

(75) Inventor: Hiroshi Horikoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 159 days.

(21) Appl. No.: 10/796,655

(22) Filed: Mar. 9, 2004

(65) Prior Publication Data

US 2004/0180531 A1    Sep. 16, 2004

(30) Foreign Application Priority Data

Mar. 12, 2003   (JP) ............................ P2003-066081

(51) Int. Cl.
*H01L 21/44* (2006.01)
(52) U.S. Cl. .............. 438/674; 438/73; 438/3
(58) Field of Classification Search ............ 438/3, 438/95, 57, 73, 674–675; 365/8, 185
See application file for complete search history.

(56) References Cited

U.S. PATENT DOCUMENTS

2005/0051818 A1*   3/2005  Tuttle ..................... 257/295

FOREIGN PATENT DOCUMENTS

JP       2002-246566        8/2002

\* cited by examiner

*Primary Examiner*—Thanhha S. Pham
(74) *Attorney, Agent, or Firm*—Sonnenschein Nath & Rosenthal LLP

(57) ABSTRACT

In bit line cladding structure formation, stability and margin of the process are secured and further shrinking is achieved, and the magnetic memory device is improved in speed, reliability and yield. Method for manufacturing a magnetic memory device, comprising the steps of: forming a word line; forming a magnetoresistance effect memory element comprising a tunnel insulating layer disposed between a ferromagnetic material and being electrically insulated from the word line; forming an insulating film for covering the memory element; and forming a bit line so that it is buried in the insulating film wherein the bit line is electrically connected to the memory element and spatially crosses the word line through the memory element disposed therebetween, wherein the method has steps of removing the insulating film on the bit line side to expose the bit line and forming a soft magnetic material layer selectively only on the bit line surface.

7 Claims, 11 Drawing Sheets

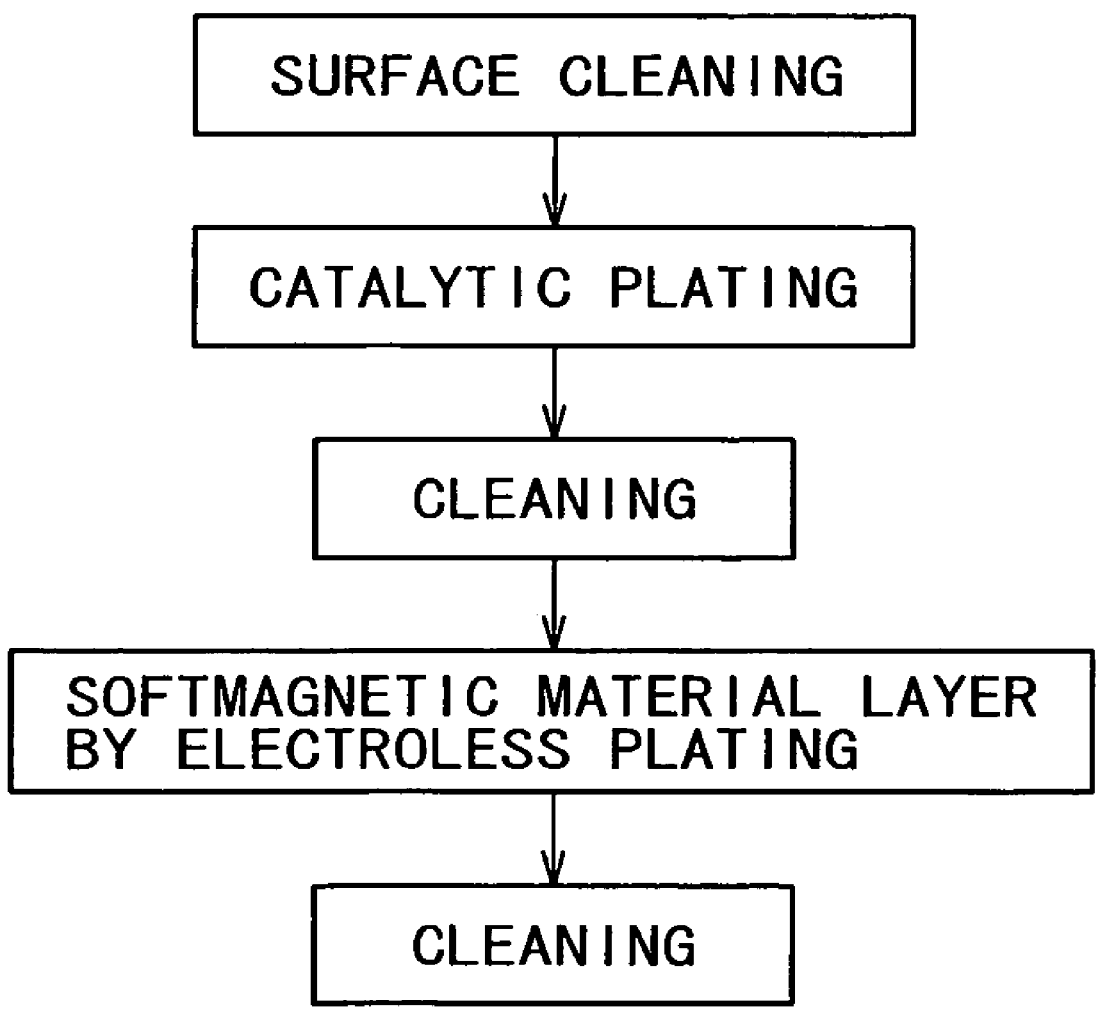

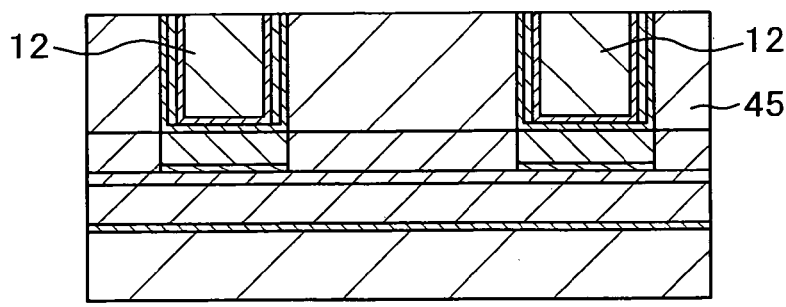
F I G. 8 A
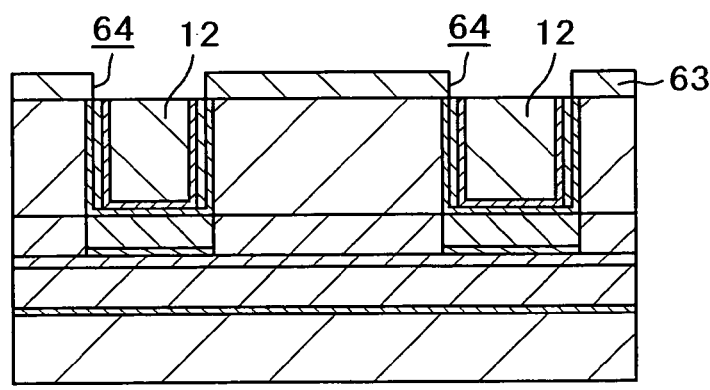
F I G. 8 B
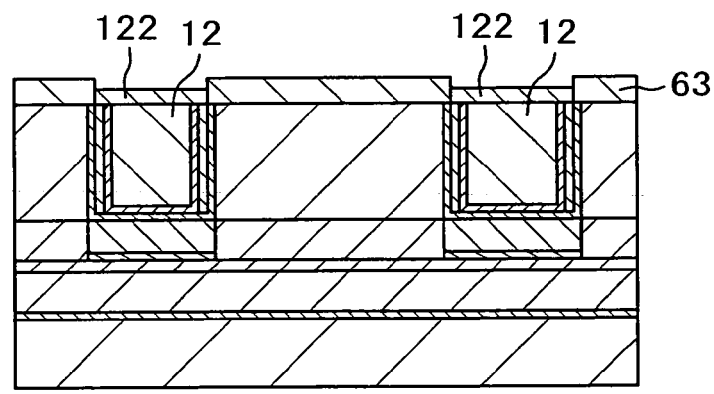
F I G. 8 C
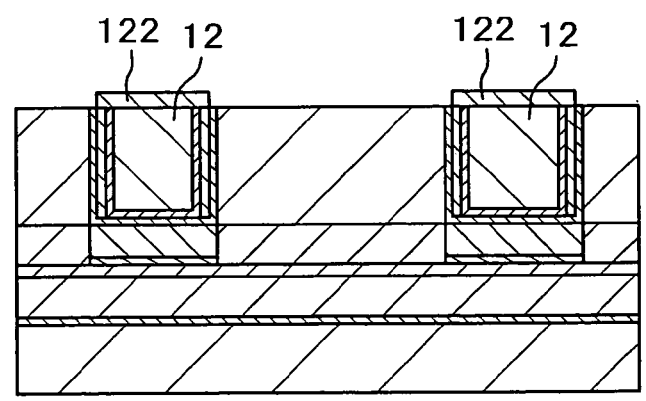
F I G. 8 D

METHOD FOR MANUFACTURING A MAGNETIC MEMORY DEVICE

CROSS REFERENCE TO RELATED APPLICATION

This application claims priority from Japanese Priority Document No. 2003-066081, filed on Mar. 12, 2003 with the Japanese Patent Office, which document is hereby incorporated by reference.

BACKGROUND OF THE INVENTION

1. Field of the Invention

The present invention relates to a method for manufacturing a magnetic memory device and a magnetic memory device. More particularly, the present invention is concerned with a method for manufacturing a nonvolatile magnetic memory device and a magnetic memory device which stores information by utilizing a change of the resistance value caused by changing of the spin direction of a ferromagnetic material to be parallel or non-parallel.

2. Description of Related Art

As information communication devices, especially small devices for personal use, such as mobile terminals, are rapidly spreading, there are demands for devices constituting such electronic devices, such as a memory element and a logic element, which have higher performance, for example, higher degree of integration, higher speed, and lower power consumption. Particularly, a nonvolatile memory is considered indispensable in the ubiquitous era.

For example, even when consumption of power supply or trouble thereof occurs, or disconnection of a server and a network occurs due to certain interference, a nonvolatile memory can protect important personal information. In addition, the increase of the density and capacity of the nonvolatile memory is more important as a technique of substitute for a hard disk or an optical disk which fundamentally cannot be miniaturized due to the presence of moving parts.

Recently available portable devices are designed so that a non-operating circuit block is maintained in a standby state to reduce the power consumption to a possible lowest level, and the waste of power consumption and memory can be avoided if a nonvolatile memory capable of serving as both a high speed network memory and a large storage capacity memory can be realized. Further, when the high-speed large-capacity nonvolatile memory can be realized, a function such that a device works the instance it is turned on, i.e., so-called "instant-on" function may be possible.

Examples of nonvolatile memories include a flash memory using a semiconductor and a ferroelectric random access memory (FERAM) using a ferroelectric material. However, the flash memory has a disadvantage in that the write speed is as low as the order of microsecond. In addition, the flash memory has also disadvantages in that the structure is complicated and hence the increase of the degree of integration is difficult, and that the access time is as slow as about 100 ns. On the other hand, with respect to the FRAM, the endurance is $10^{12}$ to $10^{14}$, and a problem has been pointed out such that the endurance is not sufficient to completely replace the existing memory by a static random access memory or a dynamic random access memory. Further, another problem that micro-fabrication of a ferroelectric capacitor is difficult is also pointed out.

As a nonvolatile memory free of the above problems, a magnetic memory called magnetic random access memory (MRAM) or magnetoresistance (MR) memory is in the limelight and, recently, tunnel magnetoresistance (hereinafter, frequently referred to simply as "TMRI") effect element materials are being improved in properties and hence the magnetic memory has attracted greater attention (see, for example, Non-patent document 1). In addition, the MRAM has a memory element formed in a wiring portion, and therefore is advantageous in that the degree of freedom for mounting of the memory portion is high, integration is easy, mounting in combination with a logic circuit is easy, the MRAM has compatibility with a complementary metal oxide semiconductor (CMOS) process, and the like.

The MRAM has a simple structure and is easy to increase the degree of integration, and stores data by utilizing rotation of a magnetic moment and therefore is expected to have higher endurance. In addition, it is expected that the access time of MRAM is very fast, and it has already been reported that the MRAM can be operated at 100 MHz (see, for example, Non-patent document 2). Further, the MRAM has been remarkably improved since a higher power can be currently obtained due to a giant magnetoresistance (GMR) effect.

Differing from a conventional memory function utilizing electrons (electricity), the MRAM is a device using as a memory medium a change of the magnetoresistance caused by changing of the direction of magnetization, which needs to operate the response of changing of the direction of magnetization at a speed equivalent to the speed of the response of the conduction of electrons. The direction of magnetization of the MRAM changes depending on the current which flows a metal wiring. That is, a current flows a wiring to generate a magnetic field in the center of the wiring. An MRAM element {TMR or magnetic tunnel junction (MTJ)} detects the magnetic field generated, so that the magnetic material in the MRAM element is magnetized in the direction linked to the direction of the magnetic field generated in the wiring. The magnetic material magnetized causes a magnetoresistance, and the magnetoresistance is read as a change of voltage or current. It is important that the magnetic field generated is efficiently introduced to the MRAM element, and this efficiency is considered to determine the operation speed and sensitivity-of the MRAM element. Factors for efficiently introducing the magnetic field to the MRAM element include: (I) generation of an intense magnetic field; (II) suppression of leakage of the magnetic field; (III) arrangement of the MRAM element in the intense magnetic field portion; (IV) high sensitivity of the MRAM element, and the like.

With respect to the factor (I), the intensity of a magnetic field depends on the current density, and, as the current density of a wiring increases, the intensity of the magnetic field increases. The increase of the current density promotes electromigration of the wiring, and hence an aluminum wiring is not used but a copper wiring is used to improve the intensity of the magnetic field. With respect to the factor (III), the problem is solved by arranging a wiring and the MRAM element so that they are close to each other. With respect to the factor (IV), the problem is solved by improving the material for and method for forming the MRAM element.

With respect to the factor (II), a detailed explanation is made. Storage in the MRAM is made by rotating the magnetization of the memory layer utilizing a current magnetic field generated by allowing a current to flow a wiring. However, as the wiring becomes thinner due to an increase of the degree of integration, the critical value of a current which can flow the writing line is lowered, so that only a weak magnetic field can be obtained, thus inevitably reducing the coercive force of a region in which data is stored. This means that the reliability of the information memory device is lowered. In addition, unlike a light or an electron beam, a magnetic field cannot be focused and this is considered to be the biggest cause of cross talk when the degree of integration is increased. For preventing this, a keeper structure and the like have been proposed, but they inevitably cause the structure to be complicated. As described above, writing using a current magnetic field has a number of fundamental problems to be solved, and the writing using a current magnetic field may be a great defect of the future MRAM.

With respect to the factor (II), an attempt is made to solve the problem by a method using a cladding structure in which a wiring portion is covered with a soft magnetic material. It is noted that the wiring is not completely covered, and the soft magnetic material is not formed on the surface on the side of the MRAM element since a magnetic field must be supplied to the MRAM element from the plane of the wiring facing the MRAM element. Specifically, a word line is generally provided under the MRAM element, and hence no soft magnetic material is formed on the word line. A bit line is provided on the MRAM element, and hence no soft magnetic material is formed under the bit line (see, for example, Non-patent document 1).

With respect to the formation of a cladding structure, several methods have been proposed, and the most general method is described below. This is a method for forming a cladding structure for word line.

The following procedure is not shown in the figure. (a): On the inner wall of a wiring trench formed in an insulating film, in which a word line is formed, a barrier metal layer, a soft magnetic material layer, and a copper seed layer are deposited by, for example, sputtering. (b): The wiring trench is filled with a wiring material by a plating process, a chemical vapor deposition process or the like. (c): The excess wiring material formed on the insulating film is removed by chemical mechanical polishing so that the wiring material remains only in the wiring trench and the surface of the insulating film is planarized, thereby forming a word line comprised of the wiring material remaining in the wiring trench.

On the other hand, the method for forming a cladding structure for bit line is complicated. One example of the method is described with reference to the diagrammatic cross-sectional views of FIGS. 9A to 9J. As shown in FIG. 9A, an element for selection (not shown), a sense line (not shown), and the like are formed on a substrate (not shown), and a first insulating film 41 is formed so as to cover them. On the first insulating film 41 is formed a second insulating film 42 in which a word line and the like are formed, and in the second insulating film 42 are formed a word line 11 having a trench wiring structure, an electrode (not shown) connected to the element for selection (not shown), and the like. On the second insulating film 42, a memory element 13 is formed above the word line 11 through a third insulating film 43 for covering the word line 11 and the electrode. The memory element 13 is comprised of, for example, a TMR element. Under the memory element 13, a by-pass line 17 comprised of an antiferromagnetic layer, a conductive layer or the like is formed and connected to the electrode. On the third insulating film 43, a forth insulating film 44 is formed so as to cover the memory element 13, and then the forth insulating film 44 is subjected to planarization so that the upper surface of the memory element 13 is exposed. Then, on the forth insulating film 44, a fifth insulating film 45 for covering the memory element 13, in which a bit line is formed, is deposited, and then a wiring trench 46 in which a bit line is formed is formed so that the upper surface of the memory element 13 is exposed to the bottom of the wiring trench and a contact hole (not shown) to the word line 11 is formed.

Then, as shown in FIG. 9B, a barrier metal layer 121 and a soft magnetic material layer 122 are successively deposited on the wiring trench 46 and the contact hole. The barrier metal layer 121 is deposited by a sputtering process, a chemical vapor deposition (hereinafter, frequently referred to simply as "CVD") process, an atomic layer deposition (ALD) process or the like, and the deposition method is selected depending on the form and size of the wiring trench in which the barrier metal layer 121 is formed. In the barrier metal layer 121, tantalum (Ta), tantalum nitride (TaN), titanium (Ti), titanium nitride (TiN), tungsten nitride (WN), zirconium nitride (ZnN), or the like may be used, and the thickness of the layer is advantageously in the range of from 5 to 50 nm. The soft magnetic material layer 122 is deposited by a sputtering process or the like. The thickness of the soft magnetic material layer 122 is required to be adjusted by changing the amount of the below-described etchback. Specifically, the etchback must meet both the requirement that the soft magnetic material layer 122 on the bottom of the wiring trench 46 be completely removed and the requirement that the soft magnetic material layer 122 remaining on the sidewall of the wiring trench 46 have a thickness sufficient to exhibit a magnetic flux focusing effect. This is affected by not only the thickness of the soft magnetic material layer 122 but also the coverage of the deposition method. For example, in a sputtering process, the side coverage is several tens % at most and the bottom coverage is several tens %. The side coverage is poor, and therefore it is required to deposit a film having a large thickness to a certain extent.

Then, as shown in FIG. 9C, the soft magnetic material layer deposited on the bottom of the wiring trench is removed (generally employing etchback by dry etching). In this step, it is important that the soft magnetic material layer 122 on the bottom of the wiring trench 46 is completely removed and that the soft magnetic material layer 122 remains on the sidewall of the wiring trench so that the thickness is sufficient to exhibit a magnetic flux focusing effect. This step generally employs anisotropic etching, and etching having high degree of anisotropy is desired since the soft magnetic material layer 122 must remain on the sidewall of the wiring trench 46, and a plasma etching technique which generates high-density etching species, such as inductively coupled plasma (ICP) or electron cyclotron resonance (ECR), is used.

Then, as shown in FIG. 9D, a barrier metal layer 123 is formed on the inner walls of the wiring trench 46 and the contact hole, and then a copper seed layer 124 is deposited thereon. The copper seed layer 124 is deposited using, for example, a sputtering process or a CVD process. The deposition method and the thickness of the layer are appropriately selected depending on the form and size of the wiring trench 46 in which a bit line is formed and the contact hole.

Further, as shown in FIG. 9E, the wiring trench 46 and the contact hole are filled with a wiring material 125 by, for example, an electro-chemical deposition (ECD) process or a CVD process.

Then, as shown in FIG. 9F, the excess wiring material 125 (including the copper seed layer 124) and barrier metal layers 123, 121 {see FIGS. 9B and 9D} on the fifth insulating film 45 are removed by chemical mechanical polishing so that the wiring material 125 remains in the wiring trench 46 and the contact hole, thereby forming a bit line 12 so that the wiring material 125, the barrier metal layers 123, 121, and the soft magnetic material layer 122 remain in the wiring trench 46 and the contact hole and planarizing the surface.

Then, as shown in FIG. 9G, on the fifth insulating film 45, a soft magnetic material layer 126 for covering the bit line 12 is deposited. The deposition of the soft magnetic material layer 126 is similar to the method described above. The material for the soft magnetic material layer 126 may contain atoms which diffuse into the device, and, in such a case, it is preferred to form a barrier metal layer under the soft magnetic material layer 126.

Then, as shown in FIG. 9H, a resist mask 51 for covering the bit line 12 and forming a magnetic material layer pattern is formed on the bit line 12 by resist application and a lithography technique. The resist mask 51 is required to completely cover the bit line 12. The reason for this is that magnetic flux leakage is caused from the portion in which the soft magnetic material layer 126 is not formed and the occurrence of magnetic flux leakage is concentrated in the magnetic flux leakage portion. The resist mask at an inappropriate position due to misalignment causes magnetic flux leakage, and therefore there is need to provide a margin in the reticle mask so that the soft magnetic material layer 126 covers the bit line 12 even when misalignment occurs.

Then, as shown in FIG. 9I, the soft magnetic material layer 126 is processed by dry etching using the resist mask 51, and then the resist film used as the resist mask 51 is peeled off, followed by cleaning, thereby forming the soft magnetic material layers 122, 126 covering the side and upper portions of the bit line 12 as shown in FIG. 9J.

In the etching for the soft magnetic material layer 126 using the resist mask 51, the resist mask 51 may have a problem of durability. In such a case, a hard mask comprised of a silicon oxide film or a silicon nitride film is used. For example, a process is employed in which the soft magnetic material layer 126 is deposited, and then a silicon oxide film or a silicon nitride film is deposited as a hard mask, and the hard mask is processed using the resist mask and the resist is peeled off, followed by etching for the soft magnetic material.

As described above, the formation of a cladding structure for word line can be practiced by a simple process and has no problem.

[Patent Document 1]

Unexamined Japanese Patent Application Laid-Open Specification No. 2002-246566 (FIG. 6 appearing at page 4)

[Non-patent Document 1]

Wang et al., IEEE Trans. Magn. 33 (1997), p. 4,498–4,512

[Non-patent Document 2]

R. Scheuerlein et al., ISSCC Digest of Papers (February 2000), p. 128–129

However, the formation of a cladding structure for bit line has several problems to be solved. The problems are listed below. A process having the number of steps as large as eight is needed. In the removal of the soft magnetic material on the bottom of the wiring trench by an etchback process using dry etching while allowing the soft magnetic material to remain on the sidewall of the wiring trench, there are problems of stability and margin of the process. For forming the soft magnetic material layer on a wiring, the soft magnetic material layer is deposited directly on an interlayer dielectric, and therefore there occurs a problem in that the interlayer dielectric suffers contamination. When employing a soft magnetic material/barrier metal structure for preventing contamination, a burden of dry etching and deterioration of flatness of the bit line are considered. For shielding a magnetic field, the bit line is required to be completely covered with the soft magnetic material. For this reason, a mask having alignment tolerance for the lithography step is needed. In other words, this process is disadvantageous for shrinking. Thus, the formation of a cladding structure for bit line has serious problems to be solved.

SUMMARY OF THE INVENTION

The present invention is directed to a method for manufacturing a magnetic memory device and a magnetic memory device, which have been made for solving all or part of the above problems.

The first method for manufacturing a magnetic memory device of the present invention is a method for manufacturing a nonvolatile magnetic memory device, which comprises the steps of: forming a first wiring; forming a magnetoresistance effect type memory element which comprises a tunnel insulating layer disposed between a ferromagnetic material and which is electrically insulated from the first wiring; forming an insulating film for covering the memory element; and forming a second wiring so that it is buried in the insulating film wherein the second wiring is electrically connected to the memory element and spatially crosses the first wiring through the memory element disposed therebetween, wherein the method has a step of removing the insulating film on a side portion of the second wiring to expose the second wiring, and a step of forming a soft magnetic material layer selectively only on a surface of the second wiring.

The first method for manufacturing a magnetic memory device has a step of removing the insulating film on a side portion of the second wiring to expose the second wiring, and a step of forming a soft magnetic material layer selectively only on a surface of the second wiring. Therefore, the sidewall of the second wiring and the upper surface of the second wiring are covered with the soft magnetic material layer selectively formed, so that a current magnetic field generated in the second wiring can be efficiently introduced to the memory element. In addition, the soft magnetic material layer is selectively formed, and hence a conventional lithography technique, etching technique or the like is not needed, and the layer can be formed by an electroless plating process, thus making it possible to reduce the number of the steps. Further, no etchback by dry etching is conducted for the soft magnetic material layer, and therefore stability and margin of the process can be secured. In addition, there is no need to consider alignment tolerance of the mask for lithography, making shrinking possible. Further, the soft magnetic material layer is not formed directly on the insulating film, and hence the insulating film suffers no contamination due to the soft magnetic material layer.

The second method for manufacturing a magnetic memory device of the present invention is a method for manufacturing a nonvolatile magnetic memory device, which comprises the steps of: forming a first wiring; forming a magnetoresistance effect type memory element which comprises a tunnel insulating layer disposed between a ferromagnetic material and which is electrically insulated from the first wiring; forming an insulating film for covering the memory element; and forming a second wiring so that it is buried in the insulating film wherein the second wiring is electrically connected to the memory element and spatially crosses the first wiring through the memory element disposed therebetween, wherein the second wiring is formed through a barrier layer in a trench formed in the insulating film, wherein the method has a step of removing the barrier layer on a sidewall of the second wiring to form a trench so that the sidewall of the second wiring is exposed, and a step of forming a soft magnetic material layer selectively only on a surface including the sidewall of the second wiring while filling the trench.

In the second method for manufacturing a magnetic memory device, the second wiring is formed through a barrier layer in a trench formed in the insulating film, and the method has a step of removing the barrier layer on a sidewall of the second wiring to form a trench so that the sidewall of the second wiring is exposed, and a step of forming a soft magnetic material layer selectively only on a surface including the sidewall of the second wiring while filling the trench. Therefore, the sidewall of the second wiring and the upper surface of the second wiring are covered with the soft magnetic material layer selectively formed, so that a current magnetic field generated in the second wiring can be efficiently introduced to the memory element. In addition, the soft magnetic material layer is selectively formed, and hence a conventional lithography technique, etching technique or the like is not needed, and the layer can be formed by electroless plating, thus making it possible to reduce the number of the steps. Further, no etchback by dry etching is conducted for the soft magnetic material layer, and therefore stability and margin of the process can be secured. In addition, there is no need to consider alignment tolerance of the mask for lithography, making shrinking possible. Further, the soft magnetic material layer is not formed directly on the insulating film, and hence the insulating film suffers no contamination due to the soft magnetic material layer.

The third method for manufacturing a magnetic memory device of the present invention is a method for manufacturing a nonvolatile magnetic memory device, which comprises the steps of: forming a first wiring; forming a magnetoresistance effect type memory element which comprises a tunnel insulating layer disposed between a ferromagnetic material and which is electrically insulated from the first wiring; forming an insulating film for covering the memory element; and forming a second wiring so that it is buried in the insulating film wherein the second wiring is electrically connected to the memory element and spatially crosses the first wiring through the memory element disposed therebetween, wherein the step of forming the second wiring comprises the steps of: forming a barrier layer in a trench formed in the insulating film; forming a soft magnetic material layer on a sidewall of the trench through the barrier layer; and forming the second wiring in the trench through the barrier layer and the soft magnetic material layer, wherein the method has a step of, after forming the second wiring, forming a soft magnetic material layer selectively on the second wiring.

In the third method for manufacturing a magnetic memory device, the step of forming the second wiring comprises the steps of: forming a barrier layer in a trench formed in the insulating film; forming a soft magnetic material layer on a sidewall of the trench through the barrier layer; and forming the second wiring in the trench through the barrier layer and the soft magnetic material layer, and therefore the soft magnetic material layer is formed on the sidewall of the second wiring. Further, the method has a step of, after forming the second wiring, forming a soft magnetic material layer selectively on the second wiring, and therefore the second wiring is surrounded by the soft magnetic material layer formed on the sidewall of the second wiring and the soft magnetic material layer selectively formed on the second wiring, so that a current magnetic field generated in the second wiring can be efficiently introduced to the memory element. In addition, the soft magnetic material layer on the second wiring is selectively formed, and hence a conventional lithography technique, etching technique or the like is not needed, and the layer can be formed by electroless plating, thus making it possible to reduce the number of the steps. In addition, there is no need to consider alignment tolerance of the mask for lithography, making shrinking possible. Further, the soft magnetic material layer is not formed directly on the insulating film, and hence the insulating film suffers no contamination due to the soft magnetic material layer.

By the method for manufacturing a magnetic memory device and the magnetic memory device of the present invention, a soft magnetic material layer can be formed selectively only on the side surface and upper surface of a bit line, so that a current magnetic field generated in the bit line can be efficiently introduced to a memory element. Therefore, the current supplied to the bit line to generate a magnetic field can be reduced, making it possible to lower the power consumption of the magnetic memory device and to improve the memory sensitivity. In addition, there is no need to reduce the distance between the bit line and the memory element to improve the write efficiency by the bit line, and hence the process margin for forming an insulating film therebetween can be broadened.

The number of the steps for forming the soft magnetic material layer can be reduced, making it possible to shorten the turn around time (TAT) and lower the running costs. The soft magnetic material film has barrier properties relative to copper, and therefore the substantial volume of copper which is the main wiring can be increased, so that the resistance of the bit line is reduced, making it possible to lower the power consumption. In addition, wiring reliability can be improved, for example, electromigration or stress migration can be prevented. Further, the soft magnetic material layer can be deposited selectively only on the surface of the bit line, and therefore there is no need to provide alignment tolerance for dealing with misalignment, enabling the cell size in a memory portion to be reduced.

It is known that electron scattering occurs in the interface between the insulating film and the bit line to considerably lower the electromigration resistance, but, in the present invention, the bit line is surrounded by the soft magnetic material film comprised of a conductive material and the barrier metal layer, and therefore there is no interface between copper constituting the bit line and the insulating material, so that an electromigration phenomenon induced by electron scattering at the interface does not occur, thus making it possible to improve the electromigration resistance.

When a soft magnetic material layer having diffusion barrier properties relative to copper is deposited, deposition of the barrier insulating film on the bit line can be generally omitted, so that the effective dielectric constant of the interlayer dielectric film can be reduced. This lowers the dielectric constant of a logic element portion in a construction in which the magnetic memory device and the logic element are formed on the same substrate, which suppresses wiring delay, so that the logic circuit can be expected to be faster.

Further, in the method of the present invention, a step of forming a soft magnetic material layer on the bottom of a wiring trench is not required, and therefore no particles are generated by etching for removing the soft magnetic material layer on the bottom of the wiring trench, so that the yield of the magnetic memory device can be improved.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 2 is a flowchart of a basic process for depositing a cobalt soft magnetic material film;

FIGS. 8A to 8D are diagrammatic cross-sectional views illustrating the steps in a method for manufacturing a magnetic memory device according to the sixth embodiment of the present invention.

DESCRIPTION OF THE PREFERRED EMBODIMENTS

The method for manufacturing a magnetic memory device and the magnetic memory device according to the first embodiment of the present invention will be described with reference to the diagrammatic cross-sectional views of steps of FIGS. 1A to 1C. The cross-sectional views for the embodiments below are those taken along the line in the width direction of a bit line, namely, cross-sectional views taken along the line in the direction of a word line.

Figure 1A:
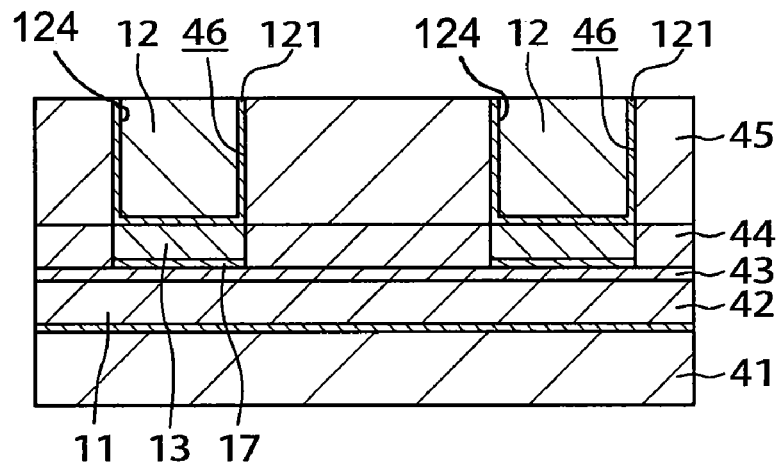
FIGS. 1A to 1C are diagrammatic cross-sectional views illustrating the steps in a method for manufacturing a magnetic memory device according to the first embodiment of the present invention.

As shown in FIG. 1A, an element for selection (not shown), a sense line (not shown), and the like are formed on a substrate (not shown), and a first insulating film 41 is formed so as to cover them. On the first insulating film 41 is formed a second insulating film 42 in which a word line and the like are formed, and in the second insulating film 42 are formed a word line (first wiring) 11 having a trench wiring structure, an electrode (not shown) connected to the element for selection (not shown), and the like. On the second insulating film 42, a memory element 13 is formed above the word line 11 through a third insulating film 43 for covering the word line 11 and the electrode. The memory element 13 is a magnetoresistance effect type memory element which comprises a tunnel insulating layer disposed between a ferromagnetic material and which is electrically insulated from the word line 11, and is comprised of, for example, a TMR element or a giant magnetoresistance (GMR) element. Under the memory element 13, a by-pass line 17 comprised of an antiferromagnetic layer, a conductive layer or the like is formed and connected to the electrode. On the third insulating film 43, a forth insulating film 44 is formed so as to cover the memory element 13, and then the forth insulating film 44 is subjected to planarization so that the upper surface of the memory element 13 is exposed. Then, on the forth insulating film 44, a fifth insulating film 45 for covering the memory element 13, in which a bit line is formed, is deposited, and then a wiring trench 46 in which a bit line is formed is formed so that the upper surface of the memory element 13 is exposed to the bottom of the wiring trench and a contact hole (not shown) to the word line 11 is formed.

Then, a barrier metal layer 121 and a copper seed layer 124 are successively deposited on the wiring trench 46 and the contact hole. The barrier metal layer 121 is deposited by a sputtering process, a CVD process, an atomic layer deposition (ALD) process or the like, and the deposition method is selected depending on the form and size of the wiring trench in which the barrier metal layer 121 is formed. In the barrier metal layer 121, tantalum (Ta), tantalum nitride (TaN), titanium (Ti), titanium nitride (TiN), tungsten nitride (WN), zirconium nitride (ZnN), or like may be used, and the thickness of the layer is advantageously in the range of from 5 to 50 nm.

The copper seed layer 124 is deposited using, for example, a sputtering process or a CVD process. The deposition method and the thickness of the layer are appropriately selected depending on the form and size of the wiring trench 46 in which a bit line is formed and the contact hole.

Then, the wiring trench 46 and the contact hole are filled with a wiring material 125 by, for example, an electrochemical deposition (ECD) process or a CVD process.

Then, the excess wiring material 125 (including the copper seed layer 124) and barrier metal layer 121 on the fifth insulating film 45 are removed by chemical mechanical polishing so that the wiring material 125 remains in the wiring trench 46 and the contact hole, thereby forming a bit line (second wiring) 12 so that the wiring material 125, the barrier metal layer 121 and the like remain in the wiring trench 46 and the contact hole and planarizing the surface.

Figure 1B:
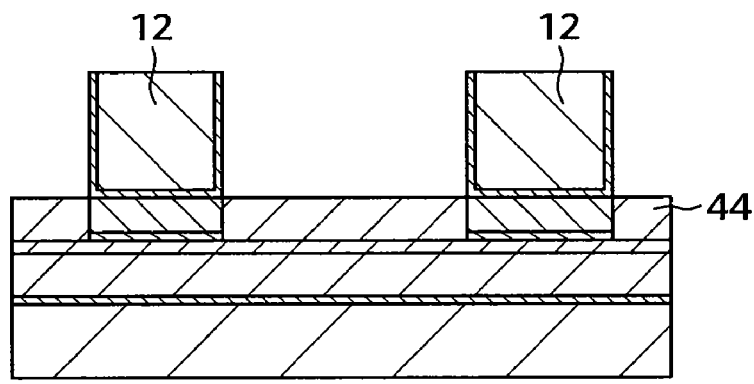

Next, as shown in FIG. 1B, the fifth insulating film 45 {see FIG. 1A} on the forth insulating film 44 is removed by etching so that the bit line 12 remains. Methods for etching include a method using a dry process and a method using a wet process.

The method using a dry process is described below. When the fifth insulating film 45 is comprised of a silicon oxide film material, etching is conducted using a carbon-fluorine (C—F) etching gas used in etching for silicon oxide film. The use of C—F etching gas enables selective etching for the bit line 12 and the fifth insulating film 45 without causing corrosion of copper in the bit line 12 or etching of the copper. As the method for etching, typical anisotropic etching (reactive ion etching: RIE) and isotropic etching (chemical dry etching: CDE) can be used.

In the above etching, it is essential that the fifth insulating film 45 does not remain on the sidewall of the bit line 12. In addition, it is required that the forth insulating film 44 in the contact hole for the bit line 12 and the word line 11 be not etched by excess over etching.

The combination of RIE and CDE enables more effective etching such that the fifth insulating film 45 does not remain on the sidewall of the bit line 12. Specifically, the insulating film is substantially completely etched by RIE. A slight film possibly remains on the sidewall in the RIE and hence subjected to isotropic etching by CDE to achieve etchback with higher precision.

In the excess over etching, when all the forth insulating film 44 in the contact hole for the bit line 12 and the word line 11 is not removed, that is, etching to expose the word line 11 is not conducted, there is no problem. By providing an etching stopper layer, etching with higher precision is possible. This is described later.

Next, the method using a wet process is described. When a silicon oxide film material is used in the fifth insulating film 45, etching using hydrofluoric acid is effective. The reason for this resides in that copper as the bit line 12 and the barrier metal layer 121 are insoluble in hydrofluoric acid, but the silicon oxide film material is readily dissolved in hydrofluoric acid. That is, the selective ratio between the fifth insulating film 45 and the bit line 12 is satisfactorily large. It is desired that the etching rate of the silicon oxide film material using hydrofluoric acid is 100 to 1,000 nm/min, and the etching rate can be controlled by changing the hydrofluoric acid concentration. The method using a wet process has problems similar to those encountered by the method using a dry process, and it is desired that an etching stopper layer is provided as mentioned above in connection with the method using a dry process, and the selective ratio is desirable 2 or more like in the dry process.

Figure 1C:
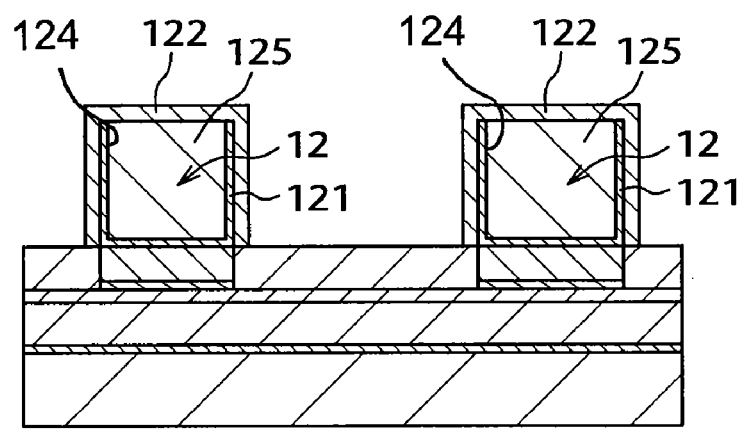

Next, as shown in FIG. 1C, a soft magnetic material layer 122 is deposited by an electroless plating process selectively on the surface to which the bit line 12 is exposed. In the present embodiment, the soft magnetic material layer 122 is formed on the surface of the barrier metal layer 121 and the surface of the wiring material 125. The electroless plating process has a feature of selective deposition such that deposition on a conductive film is made, but no deposition is made on the surface of an insulating film. In the present embodiment, selective deposition of a cobalt (Co) soft magnetic material is described, but that for a nickel (Ni) soft magnetic material is similar and, in a soft magnetic material obtained by mixing into cobalt or nickel an additive, such as iron (Fe), boron (B), phosphorus (P), tungsten (W), vanadium (V), chromium (Cr), molybdenum (Mo), or titanium (Ti), deposition having selectivity is possible.

An example of selective deposition of a cobalt soft magnetic material is described below. FIG. 2 is a basic process flow of deposition of a cobalt soft magnetic material film. The basic process flow comprises five steps as shown in the figure.

As shown in FIG. 2, first, surface cleaning is conducted. The surface cleaning is a process for removing contaminants on the forth insulating film 44 {see FIGS. 1A to 1C}, such as particles, metals, and metal ions. In the surface cleaning, washing with hydrofluoric acid is effective. When a wet process using hydrofluoric acid is used in the above-described process for removing the fifth insulating film 45, the surface cleaning process is not needed. Ultrasonic cleaning or washing with an organic acid, an organic acid containing a chelating agent, or a weak acid is effective, and, by using these in combination, a further improvement of the selectivity in the electroless plating is expected.

Then, catalytic plating is conducted. In a cobalt material, cobalt cannot be deposited directly on a metal by electroless plating, and therefore a catalyst is used. As the catalyst, palladium (Pd), platinum (Pt), silver (Ag), gold (Au), or the like maybe used. In the present embodiment, the catalytic plating using palladium (Pd) and employing substitution plating as a plating method is described. It is not particularly required to specify the palladium substitution plating because the substitution plating is an easy plating method. The palladium substitution plating is desirably conducted under the following conditions.

The palladium (Pd) concentration of the plating solution is 1,000 ppm or less, the hydrogen ion exponent of the plating solution is 2.5 or less, the temperature of the plating solution is 60° C. or lower, and the plating time is 240 seconds or less.

Then, after completion of the palladium (Pd) plating, cleaning is conducted. The cleaning is satisfactorily conducted using pure water. The cleaning after the catalytic plating can be omitted depending on the situation. For example, when palladium is deposited selectively only on the surface of the bit line 12 in the palladium substitution plating, the cleaning can be omitted. This depends on the type, deposition conditions, and deposition environment of the palladium substitution plating and the state of pretreatment. For obtaining perfect selectivity, it is desired that the cleaning process is introduced. In the cleaning, ultrasonic cleaning or washing with an organic acid, an organic acid containing a chelating agent, or a weak acid is also effective, and the combination of these achieves more excellent cleaning effect.

Next, deposition of a cobalt soft magnetic material layer 122 by electroless plating, which is the main step, is conducted. The steps described above are of pretreatment-like procedure, but, when the pretreatment is unsatisfactory, deposition having selectivity cannot be made in the electroless plating. In the electroless plating, a plating solution containing an alkali metal is generally used, but an alkali metal increases the interface state in a semiconductor, and adversely affects a semiconductor, for example, forms a pit in the semiconductor at worst. For this reason, a chemical solution containing an alkali metal cannot be used. As described in p. 90–91 of "ADMETA (Advanced Metallization Conference) 2001, Abstract of Asian Session, US Session Edition", we have succeeded in deposition of Co—W—P (cobalt-tungsten-phosphorus) using an alkali free chemical solution, and a cobalt soft magnetic material layer is formed by applying this process. The basic chemical solution is as follows. Cobalt sulfate is used as a cobalt source, ammonium citrate is used as a complexing agent, ammonium sulfate is used as a buffer, ammonium hypophosphite is used as a reducing agent, and tetramethylammonium hydroxide (TMAH) is used as a hydrogen ion exponent (pH) adjusting agent. Desired conditions for the deposition of a cobalt soft magnetic material layer by electroless plating are as follows. The hydrogen ion exponent (pH) of the plating solution is 8 to 11, the temperature of the plating solution is 55 to 80° C., and the plating time is 180 seconds or less.

After the electroless plating, washing with pure water is satisfactorily conducted to remove the plating solution. Finally, cleaning is conducted. This cleaning process may be conducted if desired. In the cleaning process, an alkali chemical is desirably used, and , when a chelating agent, a surfactant, or the like is added to the chemical, a further effect can be obtained. The combination of the alkali chemical cleaning and ultrasonic cleaning is effective. Washing with a dilute acid is also effective, but a cobalt material is dissolved in an acid and hence satisfactory care must be taken. The procedure described above is the selective deposition process for the soft magnetic material layer by electroless plating.

Next, one example in which an etching stopper layer is formed on the fifth insulating film 45 is described with reference to the views showing the steps of FIGS. 3A to 3C.

Figure 3A:
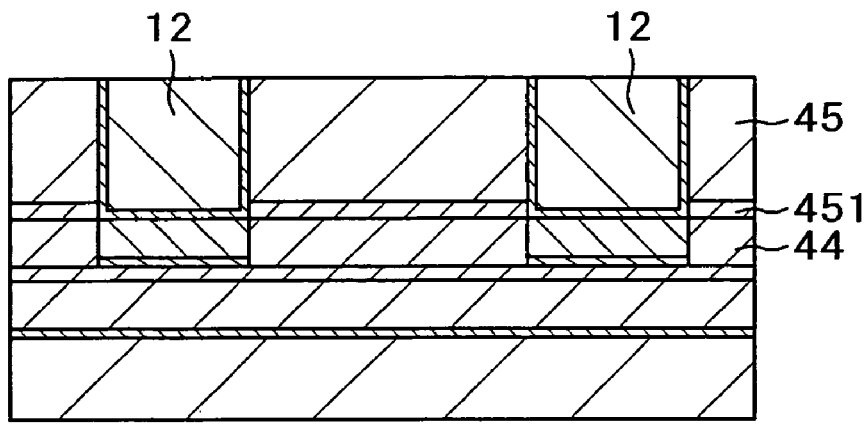
FIGS. 3A to 3C are views showing the steps in one example in which an etching stopper layer is formed.

For example, as shown in FIG. 3A, before forming the fifth insulating film 45, an etching stopper layer 451 is formed. The etching stopper layer 451 may be formed from a material which can exhibit a satisfactory etching selective ratio between the fifth insulating film 45 and the forth insulating film 44, the bit line 12 and the like. The etching stopper layer 451 can be formed from, for example, silicon nitride (SiN), silicon carbide (SiC), or amorphous carbon.

Figure 3B:
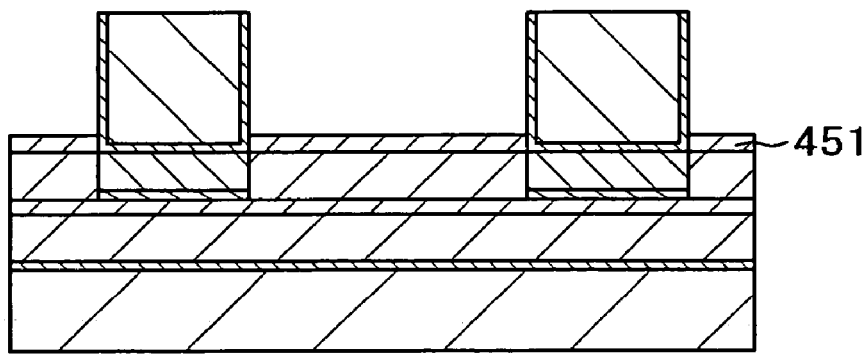

Then, as shown in FIG. 3B, the fifth insulating film 45 {see FIG. 3A} is removed by etching. The etching process is similar to that described above. Then, the etching stopper layer 451 is selectively removed by etching.

Figure 3C:
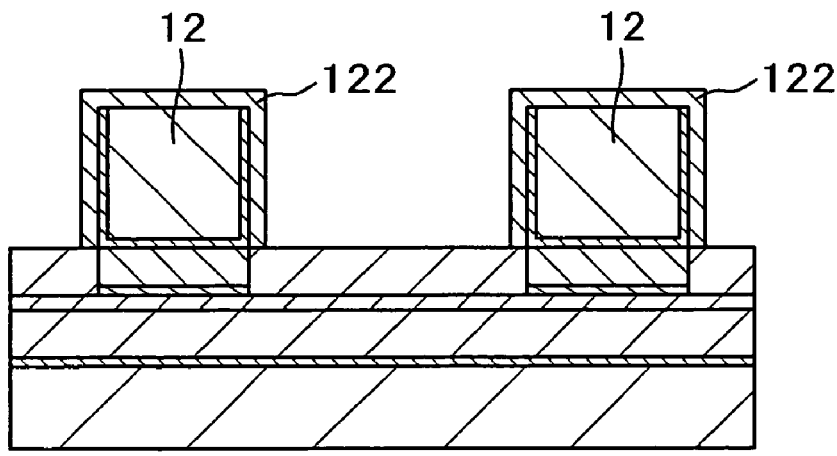

Then, as shown in FIG. 3C, the soft magnetic material layer 122 is deposited in the same manner as that described above with reference to FIG. 1C selectively on the surface to which the bit line 12 is exposed.

The fifth insulating film 45 is a sacrificial layer and to be removed, and hence a silicon oxide film containing, for example, boron (B), phosphorus (P), or a methyl group (—CH$_3$) may be used, and, as the etching stopper layer 451, non-doped silicate glass (NSG) or the like can be used.

Alternatively, the fifth insulating film 45 can be formed from a silicon oxide film doped with at least one member selected from boron (B) and phosphorus (P), a porous oxide film, such as nanoglass, a metyl silsesquioxane (MSQ) low dielectric constant film, or a silicon oxide carbide (SiOC) low dielectric constant film, and the etching stopper layer 451 can be formed from, for example, silicon nitride (SiN), silicon carbide (SiC), or amorphous carbon.

The above-described etching stopper layer is one example. Basically, the fifth insulating film 45 and the etching stopper layer 451 may have selectivity with respect to hydrofluoric acid, and, when the selectivity satisfies the below ratio for the etching rate, a stable process can be achieved. Specifically, selective ratio=(etching rate of fifth insulating film 45)/(etching rate of etching stopper layer 451)≧2 may be satisfied.

In the technique for forming the etching stopper, before forming the etching stopper 451, the forth insulating film 44 may be selectively etched to an extent corresponding to the thickness of the etching stopper layer 451 to be formed. In this etching, it is desired that the etching depth does not exceed the thickness of the electrode formed on the memory element 13.

Alternatively, in the technique for forming the etching stopper, before forming the etching stopper 451, the surface of the forth insulating film 44 can be subjected to plasma nitrization treatment, or nitrogen ion implantation, fluorine ion implantation, or carbon ion implantation to modify the surface of the forth insulating film 44, thereby forming the etching stopper layer 451.

It is desired that the forth insulating film 44 is formed from a material which is not etched in the etching for the fifth insulating film 45. For example, one of the forth insulating film 44 and the fifth insulating film 45 may be formed from an organic insulating film and another may be formed from an inorganic insulating film.

Next, the method for manufacturing a magnetic memory device and the magnetic memory device according to the second embodiment of the present invention will be described with reference to the diagrammatic cross-sectional views of steps of FIGS. 4A to 4D.

The second embodiment is a method having an effect to further improve the selectivity for the soft magnetic material layer in the first embodiment. A difference between the second embodiment and the first embodiment resides in that, after removal of the fifth insulating film, a process for removing the barrier metal layer on the bit line is introduced. By removing the barrier metal layer, the entire surface of the bit line is comprised of copper, facilitating selective growth of the soft magnetic material layer. This attributes to deposition of palladium by catalytic plating. A high melting point metal is used in the barrier metal layer, and hence it is not easy to deposit a catalyst metal layer on the barrier metal layer. On the other hand, the catalyst metal layer is easily deposited on the surface of copper. The easiness is clearly seen in the conditions for process. The main matter is described below.

Figure 4A:
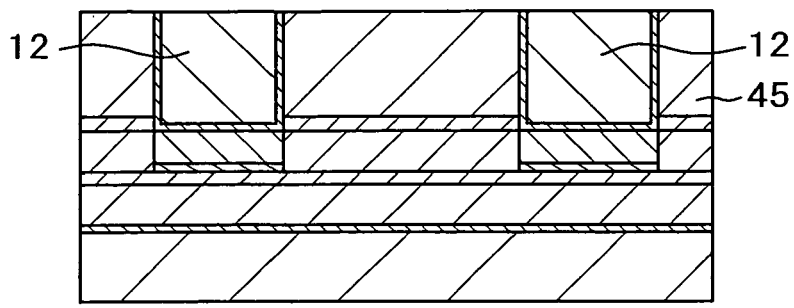
FIGS. 4A to 4D are diagrammatic cross-sectional views illustrating the steps in a method for manufacturing a magnetic memory device according to the second embodiment of the present invention.

As shown in FIG. 4A, the bit line 12 having a trench wiring structure is formed in the fifth insulating film 45 in the same manner as that described above with reference to FIG. 1A.

Figure 4B:
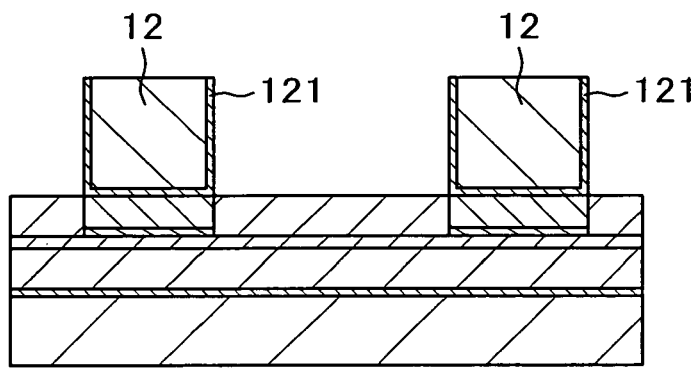

Then, as shown in FIG. 4B, the fifth insulating film 45 {see FIG. 4A} is removed in the same manner as that described above with reference to FIG. 1B so that the side surfaces of the bit line 12 are exposed.

Figure 4C:
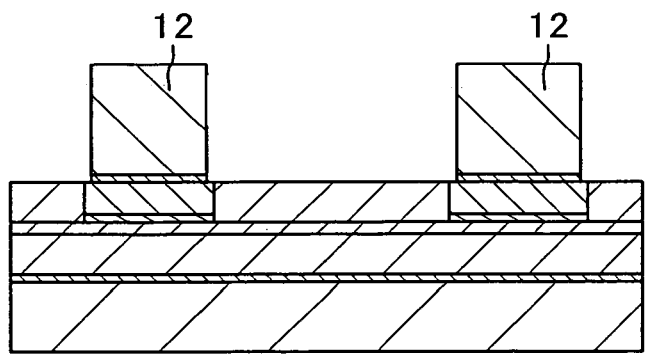

Next, as shown in FIG. 4C, the barrier metal layer 121 formed on the surface of the bit line 12 {see FIG. 4B} is removed. In the removal of the barrier metal layer 121, a dry process is preferably used, but a wet process can be used according to the material used. Examples of barrier metal materials which can be used in the wet process include titanium (Ti), tungsten (W), and tungsten nitride (WN), and these can be removed by aqueous hydrogen peroxide (H$_2$O$_2$) or hydrofluoric acid. In the dry process, a general barrier metal material, such as tantalum (Ta), tantalum nitride (TaN), vanadium nitride (VN), tungsten (W), titanium (Ti), titanium nitride (TiN), or tungsten nitride (WN), can be easily removed by using a sulfur fluoride (S—F) etching gas. Removal by sputtering is possible although the copper film is slightly reduced.

Figure 4D:
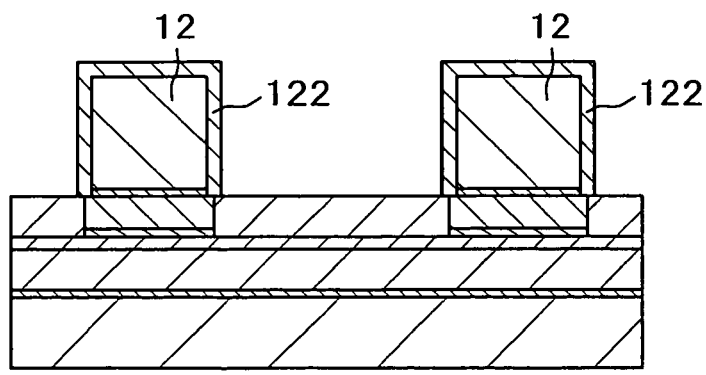

Then, as shown in FIG. 4D, the soft magnetic material layer 122 is deposited on the surface of the bit line 12 by selective deposition using electroless plating. The deposition process for the soft magnetic material layer is basically the same as that described above with reference to FIG. 2.

As mentioned above, with respect to the catalytic plating step (palladium substitution plating), palladium substitution on the barrier metal layer 121 is conducted in the first embodiment and therefore a hard process must be used, but, in the present embodiment, the barrier metal layer 121 is not formed on the bit line 12 and hence a soft process can be used. Desired conditions for the palladium catalytic substitution plating process are as follows. The palladium (Pd) concentration of the plating solution is 100 ppm or less, the hydrogen ion exponent of the plating solution is 5 or less, the temperature of the plating solution is 45° C. or lower, and the plating time is 180 seconds or less. The cleaning process before and after the catalytic plating and after the electroless plating and the electroless plating process are similar to those in the first embodiment.

Next, the method for manufacturing a magnetic memory device and the magnetic memory device according to the third embodiment of the present invention will be described with reference to the diagrammatic cross-sectional views of steps FIGS. 5A to 5E.

For achieving selective complete coverage for the bit line by electroless plating in the first and second embodiments, in the third embodiment, a so-called lift-off method is used in which a mask is formed on a portion on which a soft magnetic material layer is not deposited and a soft magnetic material layer is deposited by selective electroless plating, followed by removal of the mask. The third embodiment is described below.

Figure 5A:
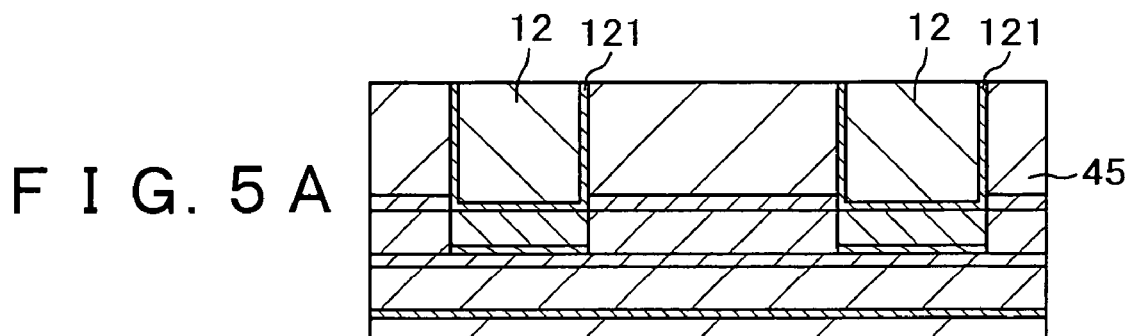
FIGS. 5A to 5E are diagrammatic cross-sectional views illustrating the steps in a method for manufacturing a magnetic memory device according to the third embodiment of the present invention.

As shown in FIG. 5A, the bit line 12 having a trench wiring structure is formed in the fifth insulating film 45 in the same manner as that described above with reference to FIG. 1A.

Figure 5B:
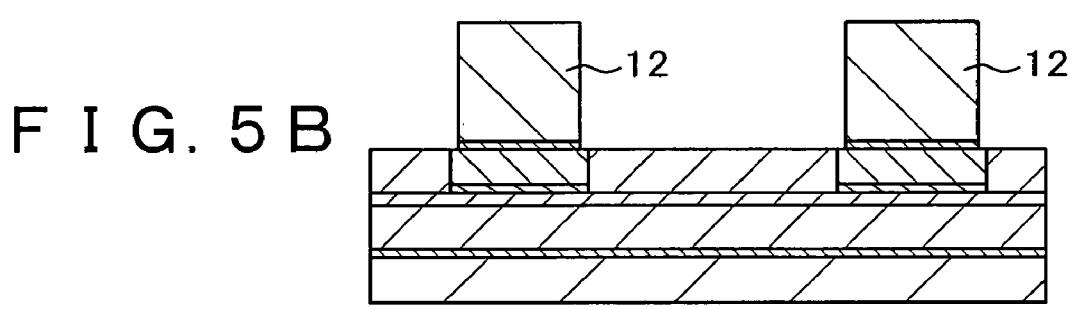

Then, as shown in FIG. 5B, the fifth insulating film 45 {see FIG. 5A} is removed in the same manner as that described above with reference to FIG. 1B so that the side surfaces of the bit line 12 are exposed. In this instance, the barrier metal layer 121 {see FIG. 5A} is also removed in the same manner as that described above with reference to FIG. 4C. Here, a state is shown such that the barrier metal layer 121 is removed, but the barrier metal layer 121 is not necessarily removed.

Figure 5C:
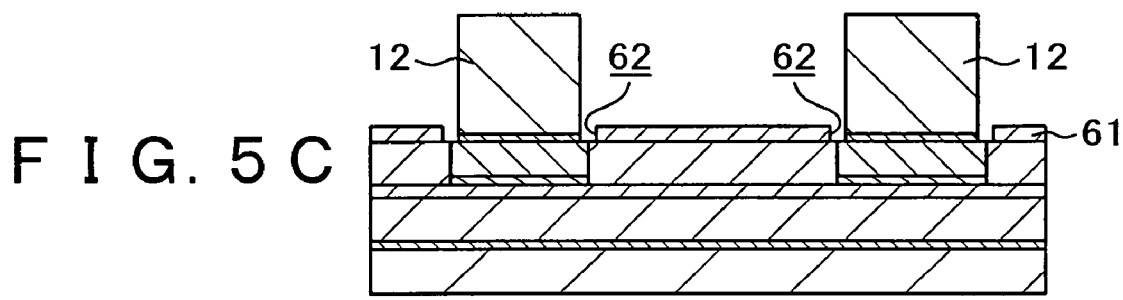

Next, as shown in FIG. 5C, a mask is formed on the region other than the bit line 12. For example, a resist is applied to the entire surface, and then a lithography step is performed using the reticle used for forming the bit line 12, thereby forming an opening portion 62 in the resist film 61 for the portion of the bit line 12.

Figure 5D:
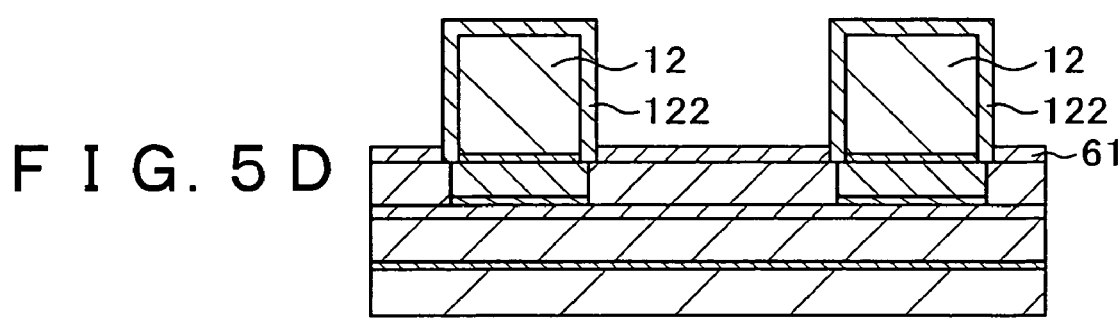

Then, as shown in FIG. 5D, the soft magnetic material layer 122 is deposited on the surface of the bit line 12 by selective deposition using electroless plating. The deposition process for the soft magnetic material layer is basically the same as that described above with reference to FIG. 2.

The resist film 61 is comprised of an insulating material, and therefore the soft magnetic material film 122 is not deposited on the resist film 61 as long as process failure or deposition of foreign matter onto the resist film 61 does not occur. Even if the soft magnetic material layer 122 is deposited on the resist film 61, it is removed by the below-described process, causing no particular problem.

Figure 5E:
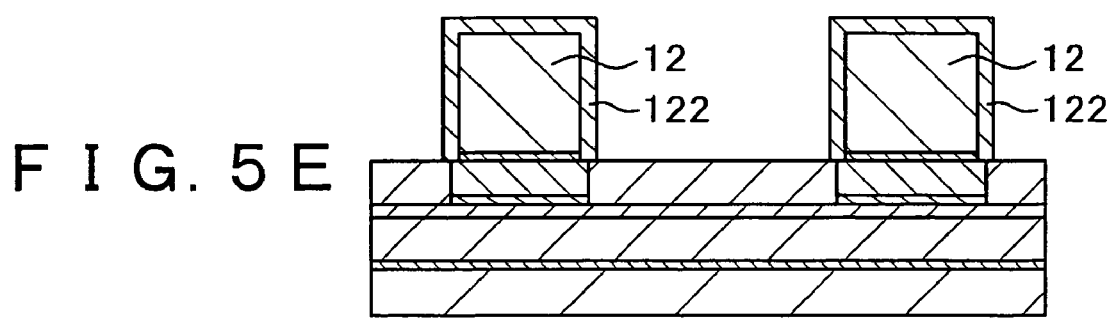

Then, as shown in FIG. 5E, the resist film 61 {see FIG. 5D} is removed, thus obtaining a construction similar to that described in the first and second embodiments, in which the soft magnetic material layer 122 is formed on the upper surface and side surface of the bit line 12.

The effect of the third embodiment is described below. In the first and second embodiments, even when the selectivity in the electroless plating deteriorates due to a certain trouble, foreign matter caused by deterioration of the selectivity is present on the resist film 61 to be peeled off finally, so that the foreign matter is removed after the process. In other words, perfect selectivity of the soft magnetic material layer 122 to the surface of the bit line 12 can be achieved. The lift-off method has a problem in that the film deposited on the mask (resist film 61) is removed and becomes foreign matter, leading to a defect of the device, but, as described above, the electroless plating in the present embodiment has a feature such that the material (soft magnetic material) to be deposited is not deposited on an insulating film, and therefore the third embodiment doe not have the above-mentioned problem of the lift-off method.

Next, the method for manufacturing a magnetic memory device and the magnetic memory device according to the forth embodiment of the present invention will be described with reference to the diagrammatic cross-sectional views of steps of FIGS. 6A to 6C.

In the forth embodiment, the basic process described in the first and second embodiments, that is, basic process in which the fifth insulating film in which a bit line is formed is removed and then the soft magnetic material layer is deposited selectively on the surface of the bit line is conducted. A difference between the forth embodiment and the first and second embodiments resides in that the fifth insulating film is not removed and the barrier metal layer on the sidewall of the bit line is removed or the barrier metal layer and a portion of the fifth insulating film corresponding to a thickness of several tens nm are removed. The forth embodiment is described below.

Figure 6A:
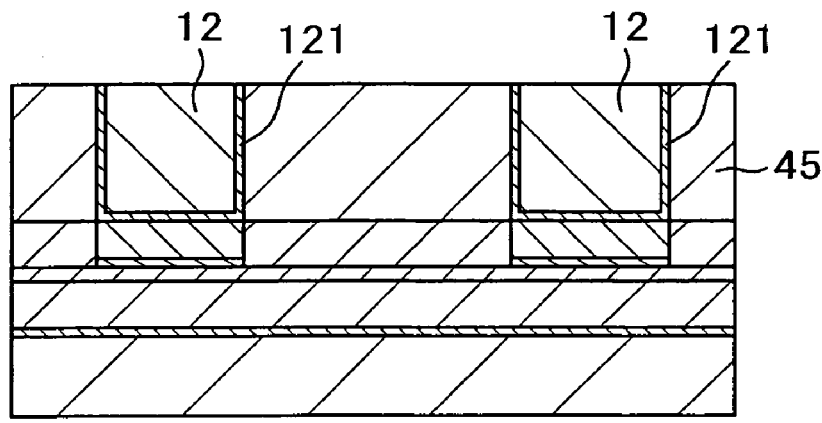
FIG. 6A to 6C are diagrammatic cross-sectional views illustrating the steps in a method for manufacturing a magnetic memory device according to the forth embodiment of the present invention.

As shown in FIG. 6A, the bit line 12 having a trench wiring structure is formed in the fifth insulating film 45 in the same manner as that described above with reference to FIG. 1A.

Figure 6B:
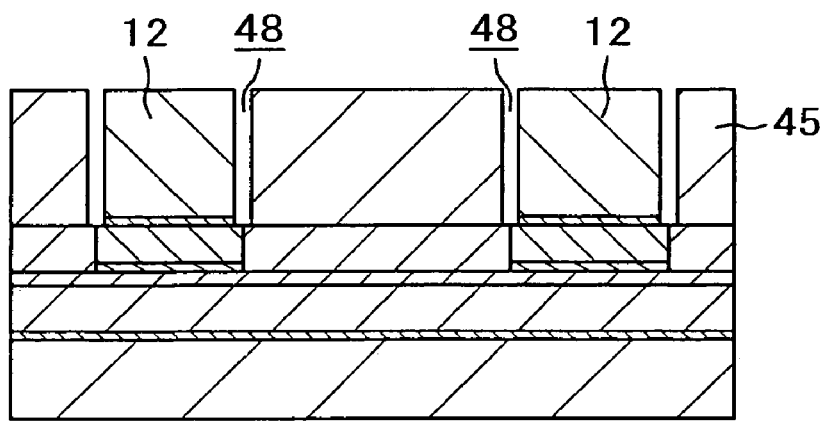

Then, as shown in FIG. 6B, the barrier metal layer 121 {see FIG. 6A} is removed, or the barrier metal layer 121 and a portion of the fifth insulating film 45 corresponding to a thickness of several tens nm, which is in contact with the barrier metal layer 121, are removed, thereby forming a trench 48 adjacent to the sidewall of the bit line 12.

In the 0.25 μm design rule or later, the bit line 12 is 0.35 μm or less in width, and therefore it is expected that the thickness of the barrier metal layer 121 formed on the sidewall of the bit line 12 using a sputtering process is 1.5 nm or less. As mentioned above, the barrier metal layer 121 can be etched using a gas containing sulfur fluoride (S—F) A process which can also etch the fifth insulating film 45 adjacent to the sidewall of the bit line 12 is an effective method, which depends on the thickness required for the burying properties and magnetic flux focusing effect of the selective deposition by electroless plating in the subsequent step. In the etching for the fifth insulating film 45, the above-mentioned dry etching process or wet etching process as such can be used. The thickness to be etched may be about several tens nm, about 50 nm at most. In the electroless plating in the subsequent step, a gap of 5 nm or more can be satisfactorily filled with the plating material.

Figure 6C:
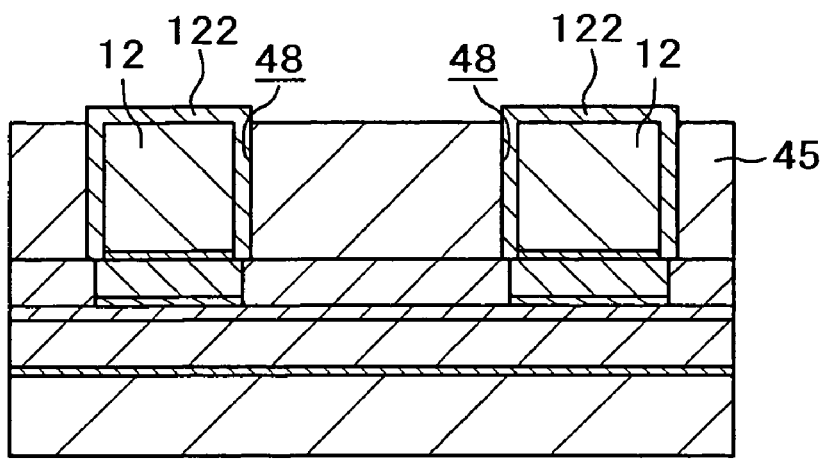

Then, as shown in FIG. 6C, the soft magnetic material layer 122 is deposited on the surface of the bit line 12 by selective deposition using electroless plating. In this instance, it is preferred that the trench 48 is filled with the soft magnetic material layer 122. The deposition process for the soft magnetic material layer is basically the same as that described above with reference to FIG. 2. In the present embodiment, the underlying layer for the soft magnetic material layer 122 corresponds to the fifth insulating film 45 and the bit line 12 which exposes copper, and hence the electroless plating process for the soft magnetic material layer described in the second embodiment can be used.

Next, the method for manufacturing a magnetic memory device and the magnetic memory device according to the fifth embodiment of the present invention will be described with reference to the diagrammatic cross-sectional views of steps of FIGS. 7A and 7B.

In the fifth embodiment, the soft magnetic material coverage (cap) on the bit line in a conventional technique is improved, and the improvement is reduction of the steps, that is, reduction of the turn around time (TAT). In the reduction of the TAT, the above-described selective deposition using electroless plating is effective. The fifth embodiment is described below.

Figure 7A:
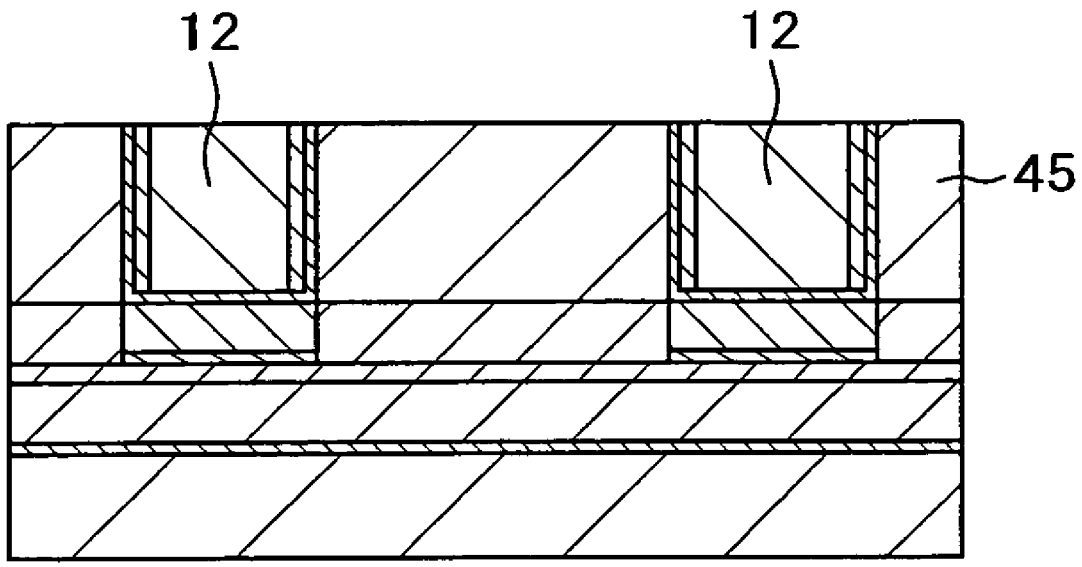
FIGS. 7A and 7B are diagrammatic cross-sectional views illustrating the steps in a method for manufacturing a magnetic memory device according to the fifth embodiment of the present invention.

As shown in FIG. 7A, the bit line 12 having a trench wiring structure is formed in the fifth insulating film 45 in the same manner as that described above with reference to FIG. 1A.

Figure 7B:
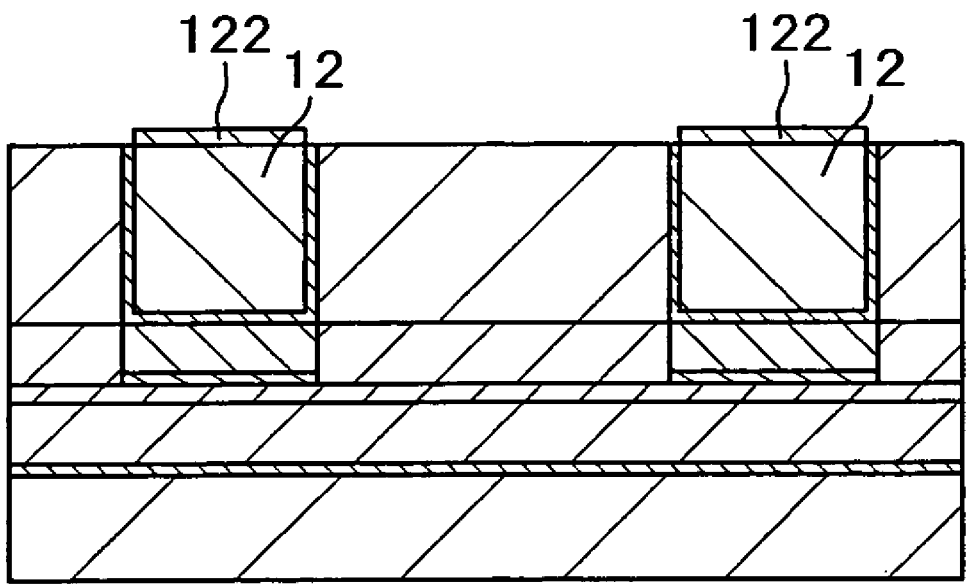
Figure 9A:
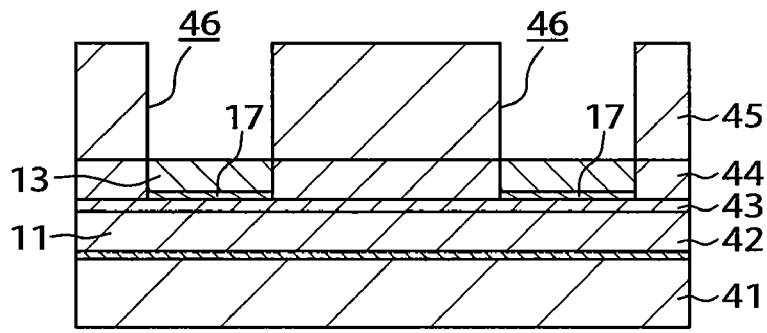
FIGS. 9A to 9J are diagrammatic cross-sectional views illustrating the steps in a conventional method for manufacturing a magnetic memory device.
Figure 9B:
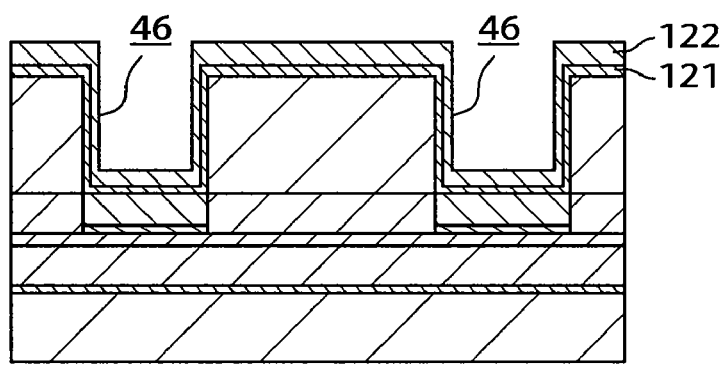
Figure 9C:
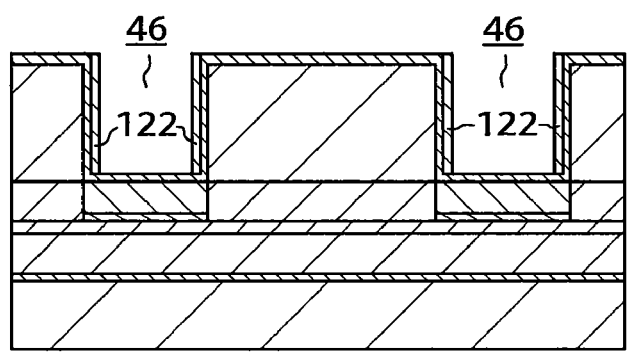
Figure 9D:
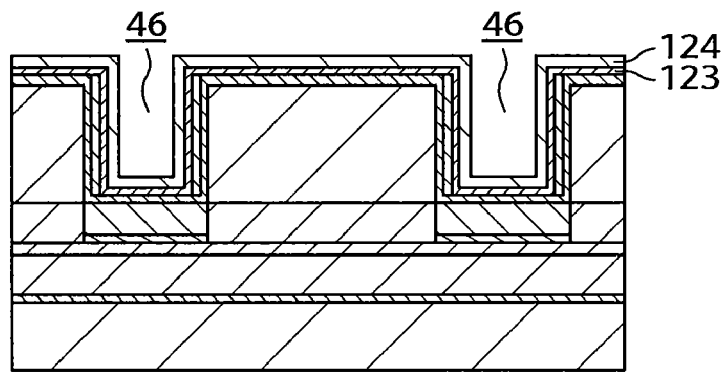
Figure 9E:
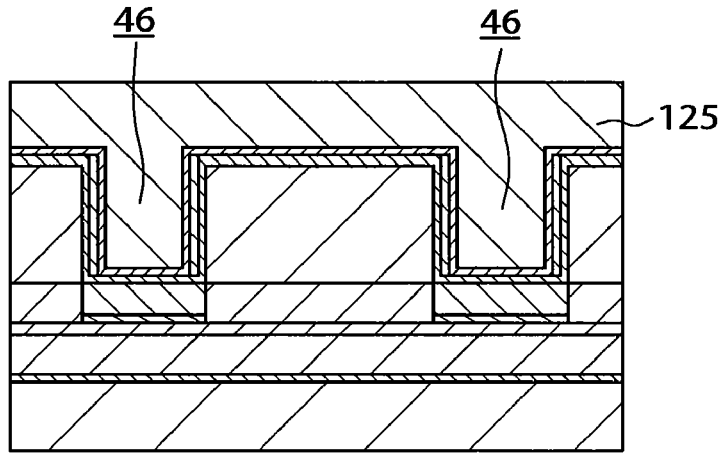
Figure 9F:
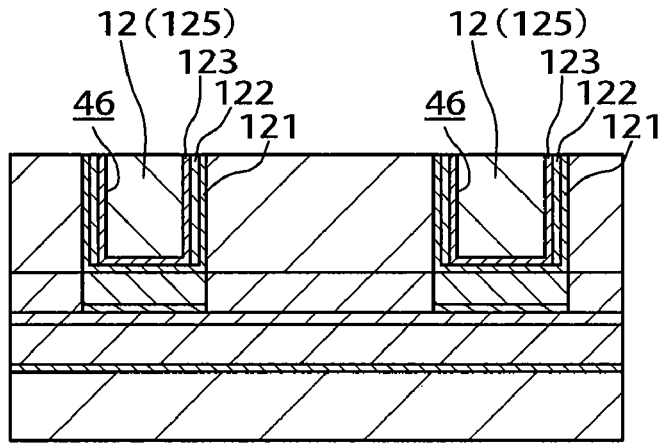
Figure 9G:
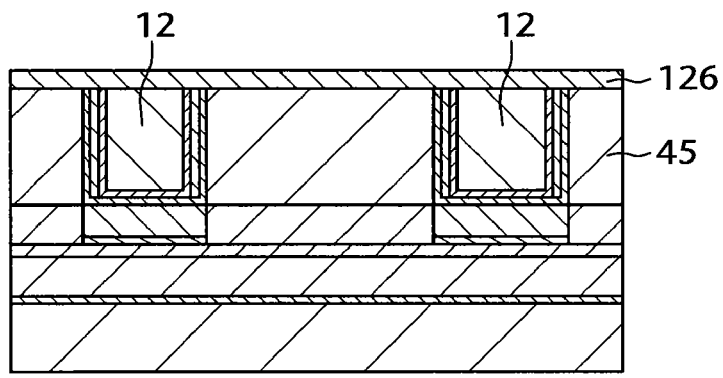
Figure 9H:
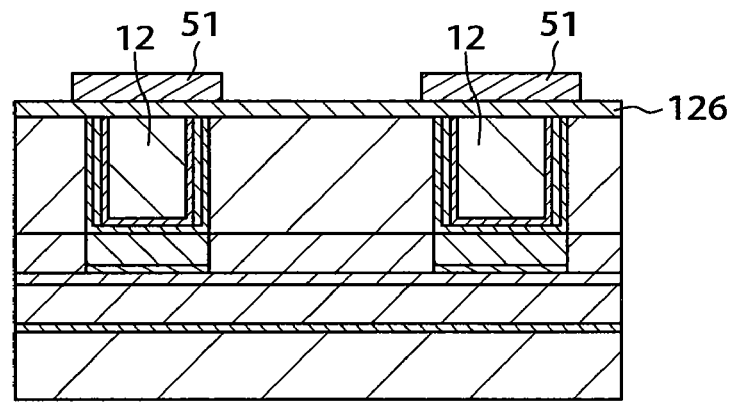
Figure 9I:
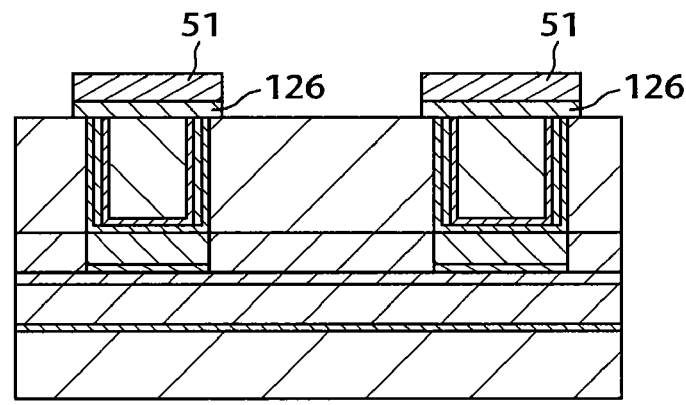
Figure 9J:
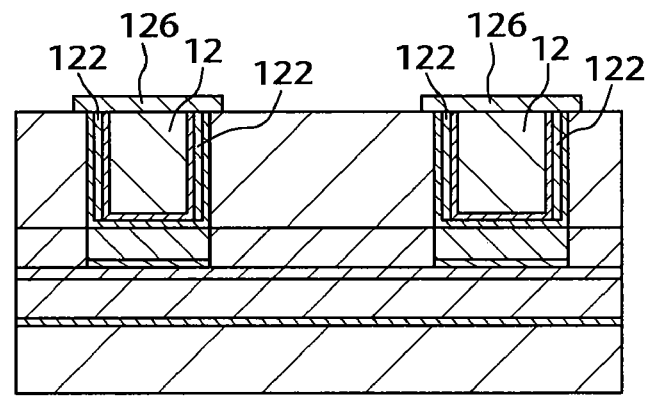

Then, as shown in FIG. 7B, the soft magnetic material layer 122 is deposited only on the surface of the bit line 12 by selective deposition using electroless plating. The deposition process for the soft magnetic material layer is basically the same as that described above with reference to FIG. 2. In the present embodiment, the underlying layer for the soft magnetic material layer 122 corresponds to the bit line 12 which exposes copper, and hence the electroless plating process for the soft magnetic material layer described in the second embodiment can be used.

Next, the method for manufacturing a magnetic memory device and the magnetic memory device according to the sixth embodiment of the present invention will be described with reference to the diagrammatic cross-sectional views of steps The sixth embodiment is a method in which a lift-off method using a resist mask is used for obtaining perfect selectivity of electroless plating. The sixth embodiment is described below.

As shown in FIG. 8A, the bit line 12 having a trench wiring structure is formed in the fifth insulating film 45 in the same manner as that described above with reference to FIG. 1A.

Then, as shown in FIG. 8B, a mask is formed on the region other than the bit line 12. For example, a resist is applied to the entire surface, and then a lithography step is performed using the reticle used for forming the bit line 12, thereby forming an opening portion 64 in the resist film 63 for the portion of the bit line 12. The resist film 63 is a mask for lift-off and is not used in general plasma etching, and therefore it does not require a process for improving the resist resistance, such as UV curing. The thickness of the resist film is not particularly limited as long as patterning with high precision can be made and it is larger than the thickness of the soft magnetic material layer deposited on the resist film. Therefore, it is desired that the thickness of the resist film is in the range of 500 nm or less.

Next, as shown in FIG. 8C, the soft magnetic material layer 122 is deposited on the surface of the bit line 12 by selective deposition using electroless plating. The deposition process for the soft magnetic material layer is basically the same as that described above with reference to FIG. 2. In the present embodiment, the underlying layer for the soft magnetic material layer 122 corresponds to the bit line 12 which exposes copper, and hence the electroless plating process for the soft magnetic material layer described in the second embodiment can be used.

The resist film 63 is comprised of an insulating material, and therefore the soft magnetic material film 122 is not deposited on the resist film 63 as long as process failure or deposition of foreign matter onto the resist film 63 does not occur. Even if the soft magnetic material layer 122 is deposited on the resist film 63, it is removed by the below-described process, causing no particular problem. In addition, the plating selectivity has an additional effect to reduce the foreign matter in the resist removing step in the subsequent step.

Then, as shown in FIG. 8D, the resist film 63 {see FIG. 8C} is removed, thus obtaining a construction similar to that described in the first and second embodiments, in which the soft magnetic material layer 122 is formed on the upper surface and side surface of the bit line 12. In the resist removing step, the soft magnetic material layer 122 is not deposited on the resist film 63 and the resist film 63 is not cured, and therefore the resist can be easily removed. In addition, the soft magnetic material layer 122 comprised mainly of cobalt is not oxidized in an oxygen plasma at about 200° C., and hence removal of the resist by ashing is possible.

A general problem of the lift-off method is that a material deposited on a resist is peeled off the resist to become foreign matter, but, as mentioned above, the soft magnetic material layer 122 is not deposited on the resist film 63, and hence it is considered that there is no foreign matter caused by the deposited material peeled off the resist film 63.

In the above embodiments, the number of the steps can be reduced, as compared to that in the process described in connection with the conventional technique. A soft magnetic material layer is deposited by electroless plating, and hence the soft magnetic material layer is deposited selectively only on a bit line. Therefore, the soft magnetic material layer is not formed on the surface of an insulating film, causing the insulating film to suffer no contamination due to the soft magnetic material layer. In addition, the soft magnetic material layer is deposited by electroless plating, and therefore the process is free of a burden of dry etching for the soft magnetic material layer unlike the conventional technique. Further, the sidewall and upper surface of the bit line can be completely covered with the soft magnetic material layer, and therefore leakage of a current magnetic field generated in the bit line is prevented, so that the current magnetic field can be efficiently introduced to a memory element. Furthermore, by adding to the soft magnetic material layer an additive for reinforcing the crystal grain boundary in the soft magnetic material layer, a material having diffusion barrier properties relative to copper can be prepared.

In the first to forth embodiments, the soft magnetic material is formed on the sidewall and upper surface of the bit line by electroless plating. Therefore, the stability of the process is improved, as compared to that of a conventional technique in which a soft magnetic material layer is formed in a wiring trench and etched back so that the soft magnetic material layer remains on the sidewall of the bit line, and there is no need to secure a margin required in the conventional technique when forming the soft magnetic material layer on the upper surface of the bit line, thus making shrinking of the element possible.

In the present invention, by employing the electroless plating process having selectivity in deposition of the soft magnetic material film, a cladding structure in which the soft magnetic material layer 122 is formed on the upper surface and side surface of the bit line 12 can be formed by a simple and stable process. In addition, the coverage of the deposition by electroless plating is extremely excellent, as compared to that of the deposition by a dry process, and deposition with a coverage of almost 100% is also an advantage obtained by employing the electroless plating process. Further, the deposition of a soft magnetic material, such as cobalt (Co) or nickel (Ni), by the electroless plating process has conventionally been effective in a protective film, a coating material, a magnetic head, and the like, and application of the deposition to semiconductor facilitates the process.

Another important process of the present invention for solving the problems is removal of the fifth insulating film 45 around the sidewall of the bit line 12. In the removal of the fifth insulating film 45, either dry etching or wet etching can be used. In the dry etching, an etchback process for entire surface as used in the conventional technique is used, and the film to be etched back is comprised of an insulating material, such as an oxide film or a nitride film. The etchback process for insulating material is a technique which has been used in semiconductor from the 2.0 μm node generation and satisfactorily effective. On the other hand, with respect to the etchback technique for metal which is a conventional technique, the first one is an etchback technique for tungsten film in the 0.8 μm node generation, and the etchback technique for tungsten is currently being changed to a chemical mechanical polishing (CMP) technique from the viewpoint of improving the yield. Specifically, in the conventional technique in which a metal film on the bottom of a bit line is removed to form a clad of the bit line, the etchback technique for metal is employed and therefore particles generated causes a problem of contamination and the like. In the removal of the insulating film by wet etching, the film can be removed using a hydrogen fluoride chemical solution. When the bit line 12 is formed from copper, an advantage resides in that copper is insoluble in hydrofluoric acid and hence selective etching is possible.

The method for manufacturing a magnetic memory device and the magnetic memory device of the present invention can be applied to a bit line in a magnetic memory device which writes data by utilizing a magnetoresistance effect. Therefore, the construction of layers under the bit line is not limited to the construction described in the above embodiments but can be applied to, for example, a method having a construction such that an element for selection (e.g., diode) is formed on a word line and a memory element connected to the element for selection is formed and further a bit line is formed. In the above embodiments, the width of the bit line may be equivalent to or larger than the width of the memory element. For example, it is desired that the gap between the soft magnetic material layers formed on the sidewall of the bit line corresponds to the width of the memory element.

What is claimed is:

1. A method for manufacturing a magnetic memory device comprising steps of:
   forming a first wiring on a substrate;
   forming a magnetoresistance effect type memory element which comprises a tunnel insulating layer disposed between a ferromagnetic material and which is electrically insulated from the first wiring;
   forming an insulating film for covering the memory element; and
   forming second wirings so that they are buried in the insulating film wherein one of the second wirings is electrically connected to the magnetoresistive effect type memory element and spatially crosses the first wiring through the magnetoresistive effect type memory element disposed therebetween, wherein said method further comprises steps of:
   removing the insulating film on side portions of the second wirings to expose the second wirings; and
   forming a soft magnetic material layer selectively on a side surface and a top surface of each of the second wirings, but not as a continuous layer from one of the second wirings to an adjacent one of the second wirings.

2. The method for manufacturing a magnetic memory device as cited in claim 1, wherein:
   said magnetic memory device is a nonvolatile magnetic memory device.

3. The method for manufacturing a magnetic memory device as cited in claim 1, wherein:
   said soft magnetic material layer is formed by an electroless plating process.

4. The method for manufacturing a magnetic memory device as cited in claim 1, wherein:
   said insulating film on the side portions of the second wirings comprises an etching stopper layer and an interlayer insulating layer formed on the etching stopper layer; and
   etching is once stopped when removing said interlayer insulating layer at step for removing the insulating film on the side portions of the second wirings to expose the second wirings.

5. The method for manufacturing a magnetic memory device as cited in claim 1, wherein:
   said second wirings are formed in trenches formed in said insulating film via barrier layers; and
   said barrier layers on the side portions of the second wirings are removed after said insulating film is removed and before said soft magnetic material layer is formed.

6. The method for manufacturing a magnetic memory device as cited in claim 1, wherein:
   said second wirings are formed in trenches in said insulating film via barrier layers; said method for manufacturing a magnetic memory device further comprises a step of forming a mask pattern between said second wirings after said insulating film is removed and before said soft magnetic material layer is formed; and
   said step for forming the soft magnetic material layer on the side surface and the top surface of each of the second wirings comprises the steps of:
   forming the soft magnetic material layer selectively on the side surface and the top surface of each of the second wirings while using said mask pattern as a mask; and
   removing said mask pattern after that.

7. The method for manufacturing a magnetic memory device as cited in claim 1, wherein:
   said second wirings are formed in trenches in said insulating film via barrier layers; said method for manufacturing a magnetic memory device further comprises, after said insulating film is removed and before said soft magnetic material layer is formed, steps of:
   removing said barrier layers on the side portions of the second wirings; and forming a mask pattern between said second wirings; and
   said step for forming the soft magnetic material layer on the side surface and the top surface of each of the second wirings comprises steps of:
   forming the soft magnetic material layer selectively on the side surface and the top surface of each of the second wirings while using said mask pattern as a mask; and
   removing said mask pattern after that.

* * * * *